United States Patent
Wang et al.

(10) Patent No.: US 7,071,009 B2
(45) Date of Patent: Jul. 4, 2006

(54) MRAM ARRAYS WITH REDUCED BIT LINE RESISTANCE AND METHOD TO MAKE THE SAME

(75) Inventors: Po-Kang Wang, San Jose, CA (US); Liubo Hong, San Jose, CA (US)

(73) Assignees: Headway Technologies, Inc., Milpitas, CA (US); Applied Spintronics Inc., Milpitas, CA (US)

( * ) Notice: Subject to any disclaimer, the term of this patent is extended or adjusted under 35 U.S.C. 154(b) by 43 days.

(21) Appl. No.: 10/816,041

(22) Filed: Apr. 1, 2004

(65) Prior Publication Data

US 2005/0221511 A1     Oct. 6, 2005

(51) Int. Cl.
*H01L 21/00*     (2006.01)
(52) U.S. Cl. .................. 438/3; 257/E21.001
(58) Field of Classification Search ........... 438/3, 438/673, 694; 257/E21.001
See application file for complete search history.

(56) References Cited

U.S. PATENT DOCUMENTS

| | | | |
|---|---|---|---|
| 6,365,419 B1 | 4/2002 | Durlam et al. ............. | 438/3 |
| 6,473,328 B1 | 10/2002 | Mercaldi .................... | 365/130 |
| 6,545,900 B1 | 4/2003 | Böhm et al. ............... | 365/97 |
| 6,682,943 B1 | 1/2004 | Durcan et al. ............. | 438/3 |
| 6,778,430 B1 * | 8/2004 | Hidaka ....................... | 365/171 |
| 6,815,785 B1 * | 11/2004 | Ooishi ........................ | 257/421 |
| 6,873,542 B1 * | 3/2005 | Gider et al. ............... | 365/158 |
| 6,940,749 B1 * | 9/2005 | Tsang ......................... | 365/171 |
| 2004/0120185 A1 * | 6/2004 | Kang et al. ................ | 365/158 |
| 2004/0195602 A1 * | 10/2004 | Yoda et al. ................ | 257/295 |
| 2005/0102720 A1 * | 5/2005 | Lee ......................... | 977/DIG. 1 |
| 2005/0152180 A1 * | 7/2005 | Katti ......................... | 365/158 |
| 2005/0214953 A1 * | 9/2005 | Lee et al. .................. | 438/3 |

* cited by examiner

*Primary Examiner*—B. William Baumeister
*Assistant Examiner*—Igwe U. Anya
(74) *Attorney, Agent, or Firm*—Saile Ackerman LLC; Stephen B. Ackerman

(57) ABSTRACT

Improved MRAM arrays and a method of forming the same are disclosed in which a bit line has thinner portions formed over MTJs and thicker portions therebetween. Bottom electrodes are formed in a first insulation layer on a substrate and then MTJs and a coplanar second insulation layer are formed thereon. After a second conductive layer comprised of lower metal lines is formed above the MTJs, a trench is formed in a stack of insulation layers above portions of the lower metal lines. A barrier layer and upper metal layer are sequentially deposited and then planarized to form a filled trench that effectively increases a bit line thickness. The lower metal layer is a thin bit line in regions over MTJs. The method may also comprise forming word lines on an insulation layer that are aligned over the MTJs and perpendicular to the bit lines.

26 Claims, 4 Drawing Sheets

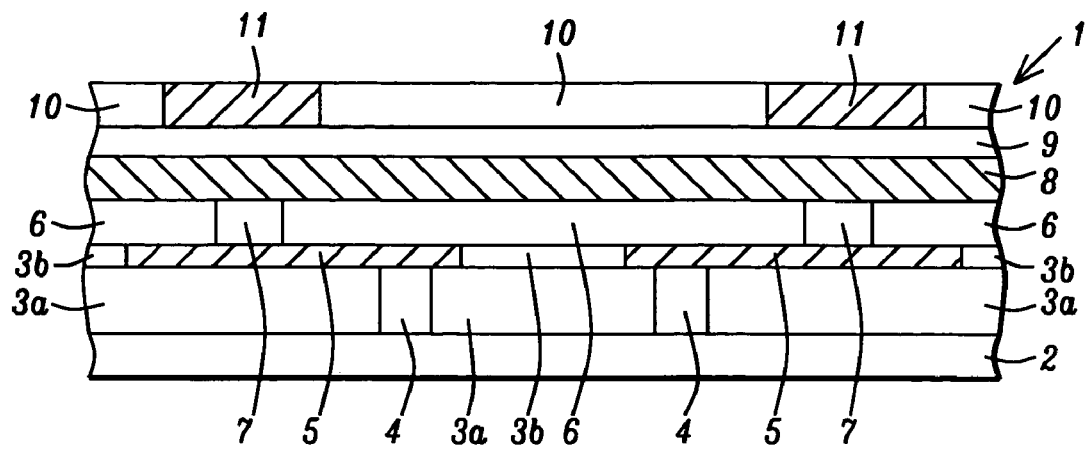
FIG. 1 – Prior Art
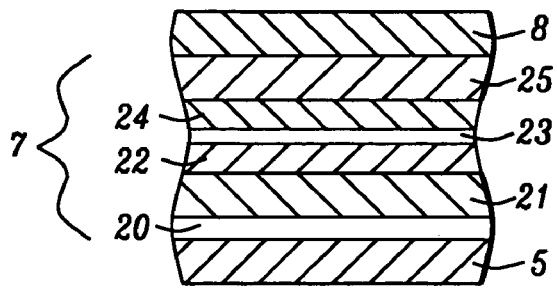
FIG. 2
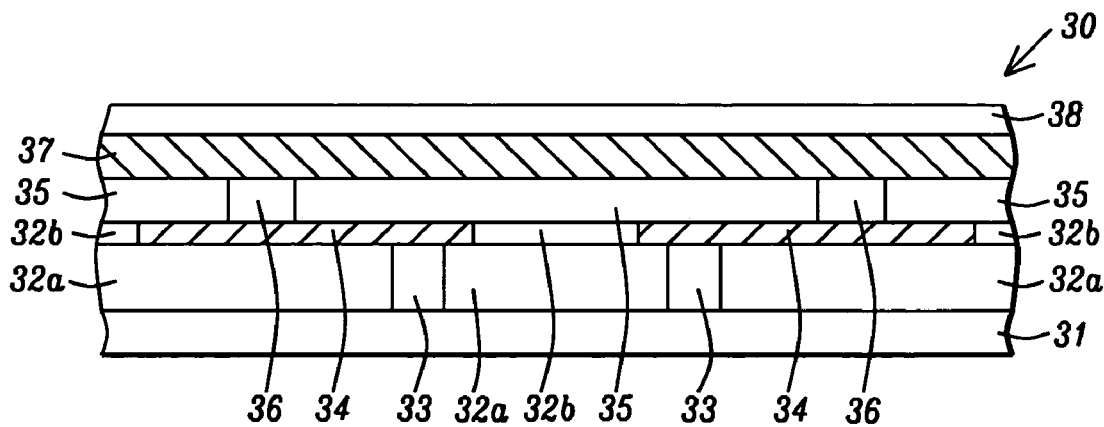
FIG. 3

MRAM ARRAYS WITH REDUCED BIT LINE RESISTANCE AND METHOD TO MAKE THE SAME

FIELD OF THE INVENTION

The invention relates to an MRAM structure, and more particularly, to an MRAM array in which the bit lines have a lower line resistance and are thicker in certain regions. The invention is also a method for fabricating the improved MRAM array.

BACKGROUND OF THE INVENTION

A magnetic random access memory (MRAM) chip is generally comprised of an array of parallel first conductive lines on a horizontal plane, an array of parallel second conductive lines on a second horizontal plane spaced above and formed in a direction perpendicular to the first conductive lines, and a magnetic tunnel junction (MTJ) formed at each location where a second conductive line crosses over a first conductive line. A first conductive line may be a word line while a second conductive line is a bit line or vice versa. Alternatively, a first conductive line may be a bottom electrode line while a second conductive line is a bit line (or word line). There may be an array of third conductive lines which is comprised of word lines (or bit lines) formed above the array of second conductive lines. Optionally, there may be an additional conductive layer that has an array of conductive lines below the array of first conductive lines. Furthermore, other devices including transistors and diodes may be formed below the array of first conductive lines.

The MTJ consists of a magnetoresistive stack of layers with a configuration in which two ferromagnetic layers are separated by a thin non-magnetic dielectric layer. One of the ferromagnetic layers is a pinned layer in which the magnetization (magnetic moment) direction is fixed by exchange coupling with an adjacent anti-ferromagnetic (AFM) pinning layer. The second ferromagnetic layer is a free layer in which the magnetic moment direction can be changed by external magnetic fields. The magnetic moment of the free layer may change in response to external magnetic fields which can be generated by passing currents through conductive lines. When the magnetic moment of the free layer is parallel to that of the pinned layer, there is a lower resistance for tunneling current across the dielectric layer than when the magnetic moments of the free and pinned layers are anti-parallel. The MTJ stores information as a result of having one of two different magnetic states.

In a read operation, the information is read by sensing the magnetic state (resistance level) of the MTJ through a sensing current flowing through the MTJ. During a write operation, the information is written to the MTJ by changing the magnetic state to an appropriate one by generating external magnetic fields as a result of applying bit line and word line currents.

Referring to FIG. 1, a portion of a conventional MRAM chip 1 comprised of two adjacent MRAM cells with two MTJs 7 is depicted. There is a substrate 2 upon which a first insulation layer 3a is formed. Two studs 4 are formed on the substrate 2 and in insulation layer 3a in which each stud has an overlying first conductive line 5 that is coplanar with the second insulation layer 3b. A third insulation layer 6 is formed on the first conductive lines 5 and on the second insulation layer 3b. A MTJ 7 is located above each first conductive line 5 and is connected to an overlying second conductive line 8. Typically, an MRAM chip has a plurality of first conductive lines that may be sectioned and a plurality of second conductive lines and an MTJ is formed at each location where a second conductive line crosses over a first conductive line. Typically, a fourth insulation layer 9 is deposited on the second conductive lines 8. A fifth insulation layer 10 is shown on the third insulation layer and a third conductive layer comprised of an array of third conductive lines 11 is formed within the fifth insulation layer. When the second conductive lines 8 are bit lines, the third conductive lines 11 are word lines, or vice versa. For simplicity, second conductive lines 8 are referred to as bit lines with the understanding that they can be word lines. Second conductive lines 8 and third conductive lines 11 are formed in orthogonal directions. Additionally, there are devices such as transistors and diodes in the substrate 2 which are not shown in this drawing.

Referring to FIG. 2, a typical MTJ 7 is shown which consists of a stack of layers including one or more bottom seed layers 20 such as NiFeCr formed on a conductive line 5. Next, an anti-ferromagnetic (AFM) pinning layer 21 that may be MnPt, for example, is deposited on the seed layer 20. There is a ferromagnetic "pinned" layer 22 on the AFM layer 21 that may be a composite of multiple layers including CoFe layers. The tunnel barrier layer 23 above the pinned layer 22 is generally comprised of a dielectric material such as $Al_2O_3$. Above the tunnel barrier layer 23 is a ferromagnetic "free" layer 24 which may be another composite layer that includes NiFe, for example. At the top of the MTJ stack is one or more cap layers 25. In configurations where only one cap layer is employed, the cap layer 25 is comprised of conductive material such as Ta for making an electrical contact to the subsequently formed bit line 8. This MTJ stack has a so-called bottom spin valve configuration. Alternatively, an MTJ stack may have a top spin valve configuration in which a free layer is formed on a seed layer followed by sequentially forming a tunnel barrier layer, a pinned layer, an AFM layer, and a cap layer.

The density or number of MRAM cells in an MRAM chip is determined by various factors. One factor is the lithography or patterning process that has limitations on how close two elements such as two MTJs may be fabricated. Another factor which is the primary focus of the present invention is how many MRAM cells each bit line can connect. A lower bit line resistance allows more MRAM cells to be connected by the bit line and thereby increases the chip packing density. In the MRAM chip shown in FIG. 1, the bit line resistance has a lower limit which is determined by the maximum bit line width and thickness. Both of these dimensions are set by other considerations in the MRAM chip design and fabrication. Moreover, the trend in the industry is to shrink the width of a bit line to increase packing density but unfortunately the new chip designs often lead to an increase in bit line resistance. In order to reduce bit line resistance beyond what is achieved in state of the art MRAM chips, it is desirable to modify the bit line structure to increase its cross-sectional area without compromising other aspects of device performance. Furthermore, the method for fabricating an improved bit line structure should be accomplished with existing tools and materials so as not to incur additional process cost.

A method for forming minimally spaced MRAM structures is disclosed in U.S. Pat. No. 6,682,943. The width of an opening in a lithographic pattern is reduced by inserting sidewall spacers in the opening and then filling the space with a plug that later becomes an etch mask for forming a smaller critical dimension in an insulation layer between adjacent MRAM cells.

In U.S. Pat. No. 6,365,419, a high density MRAM cell array is described in which interconnect stacks are terminated with a via. This method eliminates the need for a line termination or metallization connection that would require a minimum critical dimension below about 0.1 microns which is less than current lithographic processes can accurately reproduce in a manufacturing line.

In U.S. Pat. No. 6,545,900, memory cell zones comprised of MRAM cells and peripheral circuits are nested in one another to conserve space and increase packing density. Peripheral circuits of one row of memory cell zones project into free corners of memory cell zones in adjacent rows.

A three dimensional MRAM array is disclosed in U.S. Pat. No. 6,473,328 in which multiple layers of MRAM cells are fabricated between conductive layers comprised of lines that may be oriented in a direction that is parallel or perpendicular to lines in overlying or underlying layers. A top conductive line on one MRAM cell serves as the bottom conductive line for an overlying MRAM cell. A higher chip density is achieved since only "n+1" conductive layers are required for "n" layers of MRAM cells.

SUMMARY OF THE INVENTION

One objective of the present invention is to provide an MRAM array in which a bit line that connects a plurality of MRAM cells has a low line resistance.

A further objective of the present invention is to provide an MRAM array in which the bit line that connects a plurality of MRAM cells has a greater thickness in certain regions that are not located above an MTJ.

A still further objective of the present invention is to provide a method of forming the MRAM array in accordance with the first and second objectives.

These objectives are achieved in one embodiment by providing a substrate that has a first insulation layer as an upper layer. Above the first insulation layer is a second insulation layer in which a first conductive layer that includes an array of sectioned conductive lines is formed. An array of MTJs is fabricated on the first conductive layer by conventional means so that an MTJ is formed on each section of a first conductive line at locations where bit lines in a subsequently formed second conductive layer will cross overhead. A third insulation layer is formed on the second insulation layer and first conductive layer and over the MTJs to a level that completely fills the gap between adjacent MTJs. The third insulation layer is then planarized to be coplanar with the MTJs.

A second conductive layer or lower metal layer comprised of an array of parallel bit lines having a first thickness is then formed on the third insulation layer. There is a dielectric layer formed between adjacent bit lines which is coplanar with the bit line array. A fourth insulation layer is deposited on the bit line array and is then selectively removed in certain regions above each bit line where bit line thickness will be increased in a subsequent step. A fifth insulation layer is deposited over the bit line array and on the fourth insulation layer and is comprised of a different material than in the fourth insulation layer to enable a high selectivity in a subsequent etching step. Conventional photolithography and etch steps are employed to form a pattern of trench openings in the fifth insulation layer. The etch removes the fifth insulation layer at a faster rate than the fourth insulation layer. A plurality of first trenches is formed on the fourth insulation layer and the first trenches are aligned above MTJs. During the same etch process, a plurality of second trenches is formed to uncover bit lines in regions where bit line thickness is to be increased. Each first trench has sidewalls formed in the fifth insulation layer and a bottom which is on the fourth insulation layer. A first trench is separated from a second trench by a portion of the fifth insulation layer. After a diffusion barrier layer is deposited on the sidewalls and bottoms of the first and second trenches and an upper metal layer is deposited to fill the trenches, a planarization process is used to make the upper metal layer coplanar with the fifth insulation layer. As a result, an array of word lines comprised of the upper metal layer is formed on the fourth insulation layer in the first trenches. The word lines are perpendicular to the bit lines. The upper metal layer and diffusion barrier layer formed in the second trenches together with underlying portions of the second conductive layer form a thicker bit line than the portions of a bit line between an MTJ and a word line.

The present invention is also an MRAM array formed by the method of the first embodiment. An array of sectioned first conductive lines is formed in a second insulation layer on a substrate that has an upper first insulation layer. An array of MTJs is formed on the first conductive lines and within a third insulation layer that is coplanar with the MTJs. Each MTJ is comprised of a stack of layers in which a seed layer, an AFM layer, a pinned layer, a barrier layer, a free layer, and a cap layer are formed in succession. There is an array of parallel bit lines in a second conductive layer. Each bit line contacts a plurality of MTJs and is thicker in certain regions that are not located above an MTJ. A bit line has a thinner portion comprised of a lower metal layer with a first thickness and has a thicker portion that includes conductive materials formed in a first trench on the lower metal layer. The first trench has a conformal diffusion barrier layer on its sidewalls and bottom and a planar upper metal layer on the diffusion barrier layer that fills the trench. A fourth insulation layer is formed on the lower metal layer in the bit line array above each MTJ and between thicker portions of the bit line. There is a fifth insulation layer on the fourth insulation layer which is comprised of a different material than in the fourth insulation layer. A second trench is formed on the fourth insulation layer above each MTJ and within the fifth insulation layer. The second trench is filled with the same diffusion barrier layer and upper metal layer that are in the first trench. The MRAM array is further comprised of a plurality of second trenches and the upper metal layer in the second trenches forms an array of parallel word lines. The word lines are coplanar with the fifth insulation layer and with the upper metal layer in the first trenches. The word lines are perpendicular to the bit lines.

BRIEF DESCRIPTION OF THE DRAWINGS

FIG. 1 is a cross-sectional view showing a conventional MRAM chip structure in which a uniformly thick bit line is used to connect MRAM cells.

FIG. 2 is a cross-sectional view of the various layers within an MTJ stack.

FIG. 3 is a cross-sectional view of an MRAM array comprised of two MTJs on a first conductive layer that includes first conductive lines formed in a second insulation layer, a planar bit line on the MTJs which are formed in a third insulation layer, and an overlying fourth insulation layer according to a method of the present invention.

DETAILED DESCRIPTION OF THE INVENTION

Figure 4:
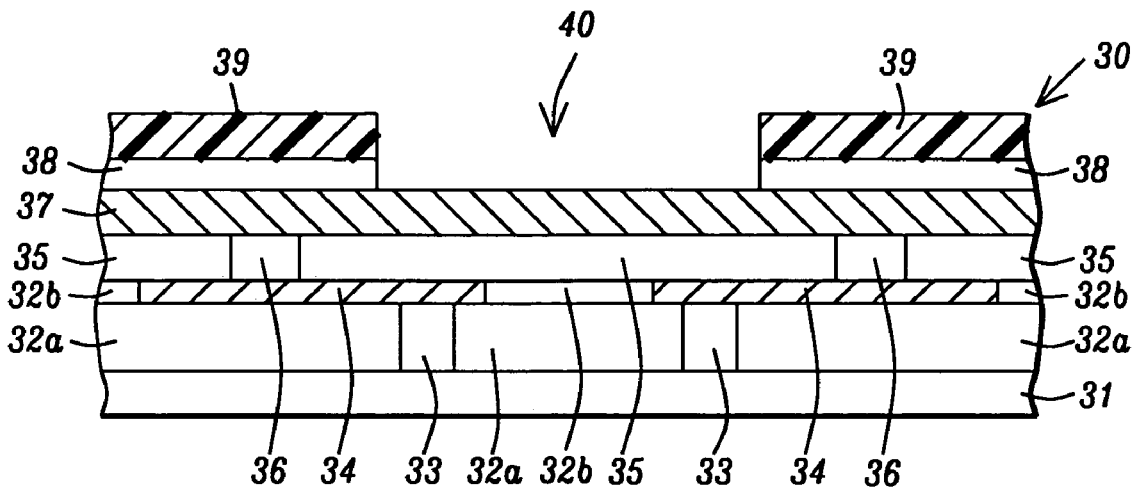
FIG. 4 is a cross-sectional view of the MRAM array in FIG. 3 after selected regions of the fourth insulation layer are removed where a bit line is to be made thicker.

The present invention is an MRAM array on an MRAM chip in which bit lines formed above MTJs are thicker in certain regions in order to reduce bit line resistance. The drawings are provided by way of example and are not intended to limit the scope of the invention. Although only two MRAM cells are depicted in the cross-sectional views, it is understood that from a top-down view there are a plurality of MRAM cells in an array that includes multiple rows and multiple columns of cells on the MRAM chip. The MRAM array encompasses MTJs as well as nearby word lines and bit lines, and insulation layers between the conductive layers. Moreover, an MTJ may have a top spin valve or a bottom spin valve configuration. A method of forming the MRAM array of the present invention will be described first and is illustrated in FIGS. 3–8.

Referring to FIG. 3, a partially completed MRAM chip structure 30 is shown that includes a substrate 31 which may be silicon or another semiconductor substrate used in the art. The substrate 31 typically contains other devices such as transistors and diodes. A first insulation layer 32*a* is deposited on the substrate 31 by a chemical vapor deposition (CVD), plasma enhanced CVD (PECVD), or spin on method and may be silicon oxide or a low k dielectric material, for example. In one embodiment, a well known damascene method is employed to form an array of studs 33 on the substrate 31 which are coplanar with the first insulation layer 32*a*. A second insulation layer 32*b* which may be comprised of the same material and formed by a similar process as previously described for the first insulation layer 32*a* is formed on the first insulation layer and on the studs 33. Then a first conductive layer comprised of sectioned conductive lines 34 which have rectangular shapes is formed by a conventional method in the second insulation layer 32*b* above the studs 33. The sectioned conductive lines 34 are also known as bottom electrodes. Typically, there is a conductive line 34 aligned above each stud 33 although other designs may be used as appreciated by those skilled in the art. A stud 33 may be comprised of W, Al, or Cu while a conductive line 34 may be comprised of Ta, Ru, W, Al, or Cu.

The final step in the sequence that forms the conductive lines 34 is usually a planarization process that makes the conductive lines coplanar with the second insulation layer 32*b*. Those skilled in the art will appreciate that there may be a thin diffusion barrier layer (not shown) along the vertical and horizontal interfaces between a conductive line 34 and the first and second insulation layers 32*a*, 32*b* and between a stud 33 and the first insulation layer 32*a* and substrate 31.

Next an array of MTJs 36 is fabricated at locations on the conductive lines 34 so that each MTJ will provide an electrical contact between a conductive line 34 and a subsequently formed bit line in a second conductive layer above the MTJ array. Each MTJ is typically comprised of a seed layer, a pinning layer, a pinned layer, a dielectric barrier layer, a free layer, and a cap layer that are formed by a conventional method which involves a layer by layer deposition of the aforementioned layers in a predetermined order, formation of a photoresist mask pattern (not shown) that protects the top surface of an MTJ, and then etching, for example, to define the MTJ sidewalls.

After the photoresist mask pattern is stripped by a plasma etch or wet stripper, a third insulation layer 35 is deposited on the MTJs 36, conductive lines 34, and second insulation layer 32*b* to a level (not shown) that is higher than the MTJs. The third insulation layer 35 is typically comprised of silicon oxide, $Al_2O_3$, or a low k dielectric material and is planarized by a method that includes a chemical mechanical polish (CMP) process. As a result, the third insulation layer 35 is preferably coplanar with the MTJs 36.

A dielectric layer (not shown) is formed on the third insulation layer 35 and MTJs 36 by a CVD, PECVD method or the like. Standard patterning and etching techniques are employed to form a pattern of openings in the dielectric layer that are subsequently filled with a second conductive layer which is also referred to as a lower metal layer 37 that has a thickness between about 200 and 3000 Angstroms. The lower metal layer 37 contacts the top surface of the MTJs 36 and has a plurality of parallel lines comprised of a copper or gold layer and an underlying diffusion barrier layer formed on the sidewalls and bottom of the openings. In one embodiment, the diffusion barrier layer is formed on an adhesion layer. Alternatively, the copper or gold layer is formed directly on an adhesion layer that coats the sidewalls and bottom of the openings. The dielectric layer separates the lines in the lower metal layer 37 and is coplanar with the lower metal layer. In one embodiment, the lower metal layer 37 is considered part of a bit line array. Alternatively, the lower metal layer 37 is part of a word line array.

In the exemplary embodiment, a fourth insulation layer 38 is deposited on the lower metal layer 37 by a CVD, PECVD, or spin-on method and has a thickness of about 100 to 3000 Angstroms (0.01 to 0.3 microns). Since the lower metal layer 37 is preferably planarized in a preceding step, an essentially planar fourth insulation layer 38 is formed during the deposition step.

Referring to FIG. 4, a photoresist layer 39 is spin coated and patterned on the fourth insulation layer 38. The pattern is comprised of a trench opening 40 that uncovers a portion of the lower metal layer 37 where the line thickness will be made thicker as explained in subsequent steps. Additionally, the pattern may include contact holes (not shown) to the lower metal layer 37. Optionally, an anti-reflective coating or ARC (not shown) may be formed on the fourth insulation layer 38 prior to coating the photoresist layer 39 in order to improve the process latitude of the patterning step. Next, a plasma etch process known to those skilled in the art is employed to transfer the trench opening 40 through the fourth insulation layer 38. Preferably, soft etch conditions are used to prevent damage to the lower metal layer 37. Alternatively, a hard mask or cap layer (not shown) may be formed on the fourth insulation layer 38 before coating the photoresist layer 39 to improve the etch selectivity during the pattern transfer through the fourth insulation layer.

Figure 5:
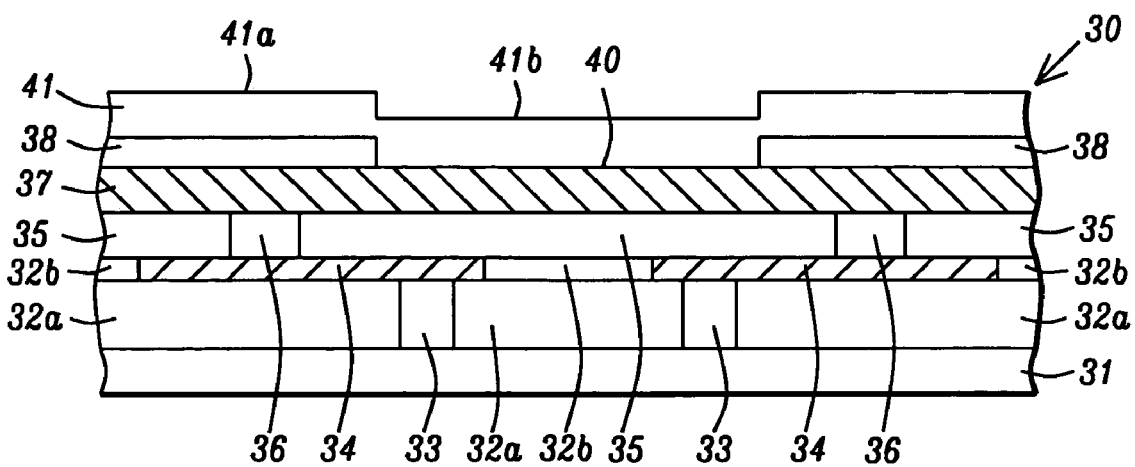
FIG. 5 is a cross-sectional view of the MRAM array in FIG. 4 after a fifth insulation layer is deposited on the patterned fourth insulation layer.

Referring to FIG. 5, the photoresist layer 39 is removed by a plasma etch or wet stripper. In the embodiment where an ARC or hard mask is formed on the fourth insulation layer, the same plasma etch used to strip the photoresist layer 39 or an additional plasma etch may be used to remove the ARC or hard mask layer. Next, a fifth insulation layer 41 is deposited on the fourth insulation layer 38 and bit line array by a CVD, PECVD, or spin-on method and has a thickness of about 0.05 to 0.5 microns. An important feature is that the fifth insulation layer 41 is comprised of a different material than in the fourth insulation layer 38 in order to provide sufficient etch selectivity in a subsequent etching step. For example, if the fourth insulation layer 38 is comprised of aluminum oxide, then the fifth insulation layer 41 may be comprised of silicon oxide. Alternatively, the fourth insulation layer 38 may be one of silicon nitride, silicon oxynitride, and silicon carbide and the fifth insulation layer is silicon oxide or aluminum oxide. Note that the top surface 41b of the fifth insulation layer 41 is at a lower level over the opening 40 than the top surface 41a above the fourth insulation layer 38.

Figure 6:
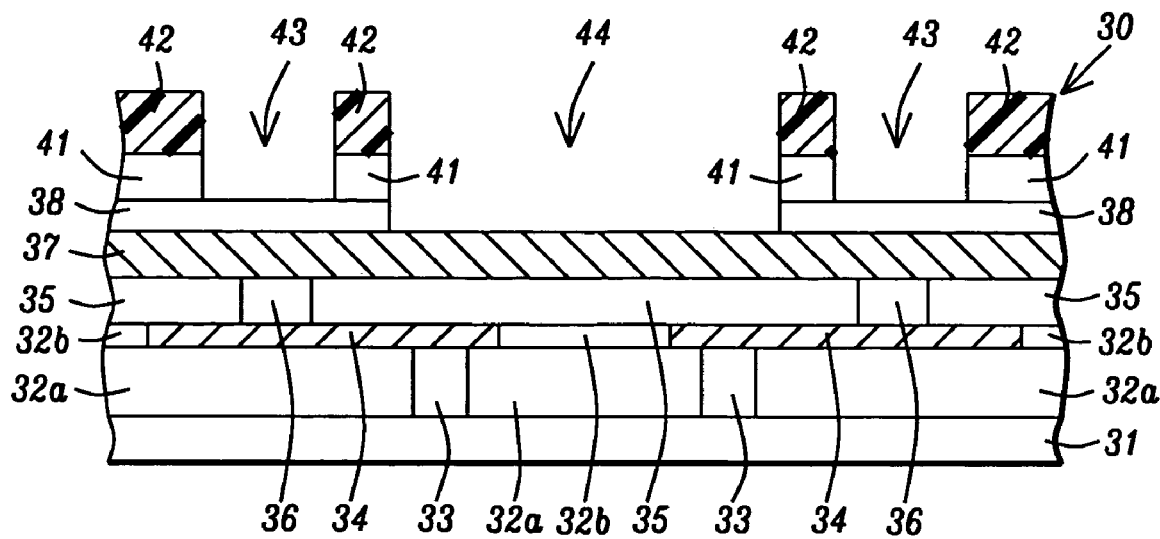
FIG. 6 is a cross-sectional view of the MRAM array in FIG. 5 after the fifth insulation layer is patterned to form first trenches on the fourth insulation layer and second trenches that uncover certain regions of the planar bit line.

Referring to FIG. 6, a second photoresist layer 42 is patterned by a conventional method on the fifth insulation layer 41 to form a pattern comprised of first trenches 43 on the fourth insulation layer 38 above the MTJs 36 and a second trench 44 above the portion of the lower metal layer 37 where the line thickness is to be increased. It is understood that a plurality of first trenches 43 and second trenches 44 are formed above the substrate 31. Optionally, an ARC or a cap layer (not shown) may be formed on the fifth insulation layer 41 prior to coating and patterning the second photoresist layer 42 to improve a subsequent patterning or etch step.

An important step in the method of the present invention is an etch process that transfers the first trenches 43 in the second photoresist layer 42 through the underlying portions of the fifth insulation layer 41 and which stops on the fourth insulation layer 38. During the same etch process, the second trench 44 and other second trenches not pictured are transferred through underlying portions of the fifth insulation layer 41 to expose portions of the lower metal layer 37. Thus, the etch process has sufficient selectivity towards the fifth insulation layer 41 to stop on the lower metal layer 37 and fourth insulation layer 38 during the pattern transfer step. It is understood that the conditions employed for the etch may vary depending upon the material in the fourth and fifth insulation layers 38, 41 and the type of etch tool. In the embodiment where the fourth insulation layer 38 is $Al_2O_3$ and the fifth insulation layer is silicon oxide, a plasma etch with a fluorine containing gas may be used to form the first trenches 43 and the second trenches 44.

Figure 7:
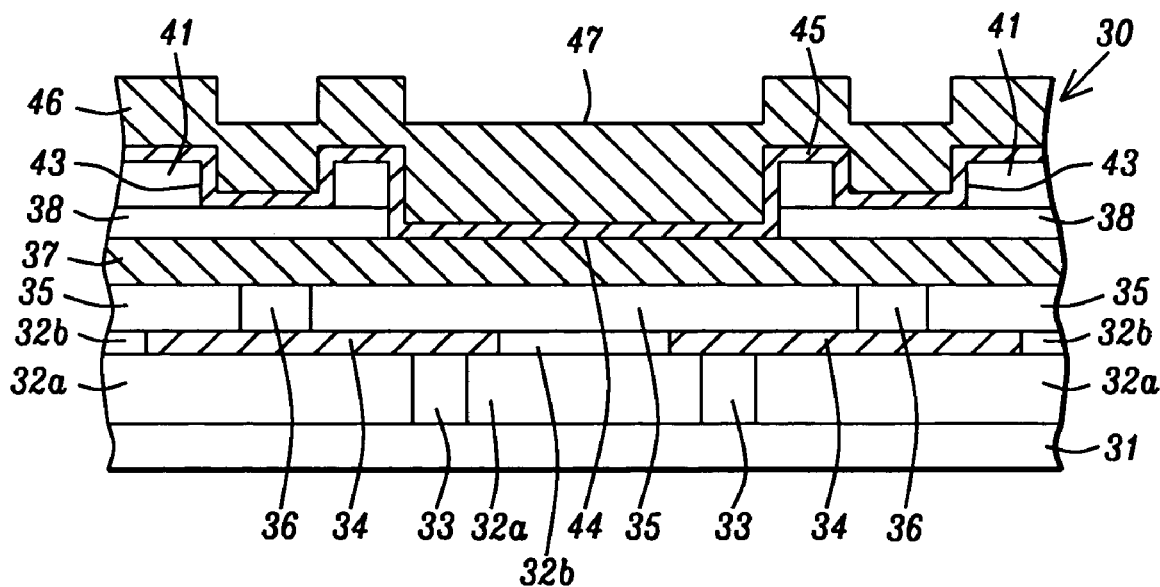
FIG. 7 is a cross-sectional view of the MRAM array in FIG. 6 after a diffusion barrier layer and metal layer are deposited to fill the first and second trenches.

Referring to FIG. 7, the second photoresist layer 42 is stripped by a plasma etch or wet stripper. If an organic ARC is present, the ARC is removed simultaneously with the photoresist layer. In an embodiment where an inorganic ARC or cap layer is formed on the fifth insulation layer prior to coating the second photoresist layer 42, then a second etch step may be necessary to remove the ARC or cap layer as is understood by those skilled in the art. A standard cleaning process may be performed at this point to remove any etch residues from within the first trenches 43 and second trenches 44. A conformal diffusion barrier layer 45 is deposited on the fifth insulation layer 41 and on the sidewalls and bottoms of first trenches 43 and second trenches 44. The diffusion barrier layer 45 may be a composite layer comprised of Ta and TaN or a composite layer comprised of Ti and TiN with a thickness of about 20 to 250 Angstroms. Next, an upper metal layer 46 comprised of copper or gold, for example, is deposited on the diffusion barrier layer 45 by an electroplating process, physical vapor deposition, or the like. The upper metal layer 46 completely fills the first trenches 43 and second trenches 44 and has an uneven top surface 47. Preferably, the diffusion barrier layer in the lower metal layer 37 is comprised of the same material as in diffusion barrier layer 45 and the conductive lines in the lower metal layer are of the same metal as in the upper metal layer 46.

Figure 8:
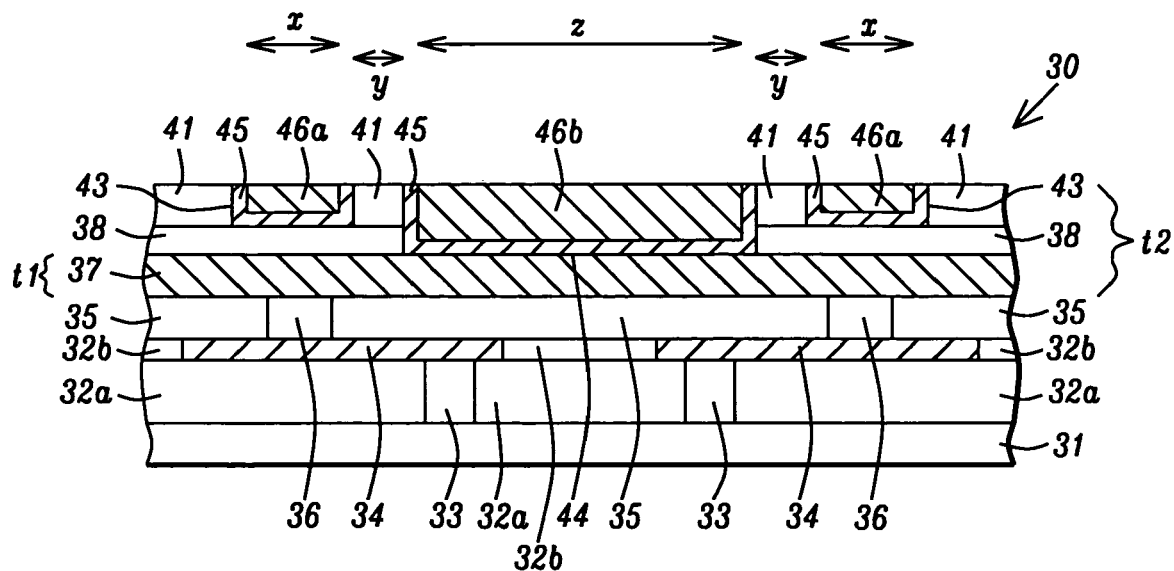
FIG. 8 is a cross-sectional view of the MRAM array in FIG. 7 after a planarization process that forms a thicker bit line region comprised of a second trench and word lines in the first trenches.

Referring to FIG. 8, a planarization process is performed so that the diffusion barrier layer 45 and upper metal layer 46 become coplanar with the fifth insulation layer 41. In the embodiment where the planarization involves a CMP process, it is understood that more than one CMP step may be used. For example, a first CMP step may be used to substantially lower the level of the upper metal layer 46, a second CMP step may remove the diffusion barrier layer 45 from above the fifth insulation layer 41, and a third CMP step may be employed to buff the upper metal layer. As a result, the filled first trenches 43 become word lines comprised of the upper metal layer 46a which are aligned in a direction that is perpendicular to the lines in the lower metal layer 37. In addition, an upper metal layer 46b is formed in the second trenches 44 and is in electrical contact with the lower metal layer 37 through the diffusion barrier layer 45.

In one embodiment, the filled second trenches 44 comprised of the upper metal layer 46b and diffusion barrier layer 45 together with the underlying portions of the lines in the lower metal layer 37 form a thicker bit line having a thickness $t_2$ of 0.08 to 1.1 microns. The remaining portions of the lower metal layer 37 that are not covered by trenches 44 have a thickness $t_1$ of 0.02 to 0.3 microns and form thinner regions of the same bit lines. Note that the thicker regions of the bit lines are not located above an MTJ 36. As a result, a plurality of parallel bit lines is formed that have thinner and thicker regions with thicknesses $t_1$ and $t_2$, respectively.

In an alternative embodiment, a plurality of word lines is formed on the MTJs 36 wherein a word line has thinner regions comprised of the lower metal layer 37 with a thickness $t_1$ and thicker regions having a thickness $t_2$ that include the lower metal layer 37 together with an overlying diffusion barrier layer 45 and upper metal layer 46b. Furthermore, the first trenches 43 which are filled with a diffusion barrier layer 45 and upper metal layer 46a are bit lines.

In one embodiment, the first trenches 43 have a length x of about 0.2 to 0.8 microns while the second trenches 44 have a length z of about 0.5 to 1.5 microns. The width y of the fifth insulation layer 41 between a first trench 43 and a second trench 44 is about 0.1 to 0.2 microns.

Figure 9:
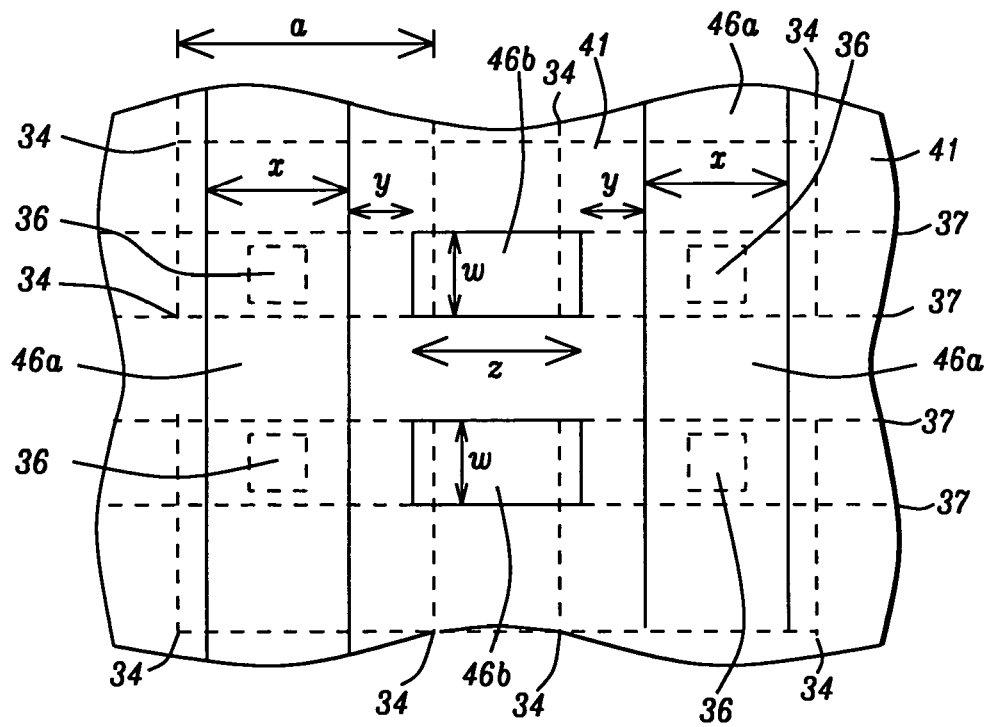
FIG. 9 is a top-down view of the MRAM array in FIG. 8 that depicts bit lines which are aligned perpendicular to word lines.

From a top-down perspective in FIG. 9, a larger portion of the MRAM chip is shown than in the cross-sectional views and has four sectioned conductive lines 34 also referred to as bottom electrodes, four MRAM cells with four MTJs 36, two bit lines comprised of a lower metal layer 37 and an upper metal layer 46b, and two word lines 46a. The diffusion barrier layer 45 is not depicted in order to simplify the drawing. Note that the width w of an upper metal layer 46b in a thicker portion of a bit line is about the same as the width of the lower metal layer 37 in the thinner portion of the same bit line. The bottom electrodes 34 have a width a that is greater than the width x and a length b that is greater than the width w which is about 0.3 to 1.2 microns.

One advantage of the method of the present invention is that a lower bit line resistance is formed that may be up to 60% less than previously achieved in prior art MRAM cell arrays because of the thicker bit line regions that increase the cross-sectional area of the bit line. Because of the lower bit line resistance, each bit line can connect more MRAM cells which enables a higher packing density.

The present invention is also an MRAM array on an MRAM chip as depicted in FIGS. 8–9. The MRAM array is formed by a previously described method and consists of MTJ cells including MTJs 36 and nearby conductive and insulation layers as well as other devices in substrate 31. Although two MRAM cells are illustrated in the exemplary embodiment in FIG. 8, it is understood that from a top-down view as in FIG. 9 the MRAM chip has a plurality of MRAM cells that are arranged in multiple rows and multiple columns.

A first insulation layer 32a is formed on a semiconductor substrate 31 that typically contains devices such as transistors and diodes. The first insulation layer 32a may be comprised of silicon oxide or a low k dielectric material. An array of studs 33 is formed on the substrate 31 and a first conductive layer comprised of sectioned conductive lines 34 is formed in a second insulation layer 32b. The conductive lines 34 are aligned over the studs 33 and are coplanar with the second insulation layer 32b. In one embodiment, the conductive lines 34 may be comprised of Ta, Ru, W, Al, or Cu and the studs 33 may be comprised of W, Al, or Cu. There is a conductive line 34 on each stud 33.

A third insulation layer 35 comprised of silicon oxide or a low k dielectric material is formed on the second insulation layer 32b and conductive lines 34. An array of MTJs 36 comprised of a stack of layers that includes a seed layer, a pinning layer, a pinned layer, a dielectric barrier layer, a free layer, and a cap layer is formed on the first conductive layer and is preferably coplanar with the third insulation layer 35. An MTJ 36 is formed at each location where a subsequently formed second line in a second conductive layer crosses over a conductive line 34 in the first conductive layer. In one embodiment, the second conductive layer is comprised of parallel second lines that are bit lines. Alternatively, the second lines are word lines.

A key feature of the present invention is that the second lines in the second conductive layer are thicker in certain regions. In the exemplary embodiment, the second lines form an array of bit lines that is comprised of a lower metal layer 37 which has a thickness $t_1$ of about 0.02 to 0.3 microns. Typically, the lower metal layer is comprised of a diffusion barrier layer or an adhesion layer and a conductive layer formed thereon. Thinner regions of a bit line comprised of the lower metal layer 37 are located above MTJs 36. Between the thinner regions are thicker regions comprised of the lower metal layer 37 and a filled second trench 44 on the lower metal layer. A second trench 44 has a length z of about 0.5 to 1.5 microns and has sidewalls and a bottom. A conformal diffusion barrier layer 45 such as a composite layer of Ta/TaN or a composite layer of Ti/TiN is formed on the sidewalls and bottom of a second trench 44. An upper metal layer 46b is formed on the diffusion barrier layer and fills a second trench. Preferably, the upper metal layer 46b is comprised of the same metal such as copper or gold that is in the conductive layer in the lower metal layer 37. The upper metal layer 46b, the surrounding diffusion barrier layer 45, and the portion of the lower metal layer 37 below the trench 44 form a thicker bit line region having a thickness $t_2$ of between 0.08 and 1.1 microns. The thicker and thinner regions of a bit line have a width w of about 0.3 to 1.2 microns.

There is a fourth insulation layer 38 which is adjacent to a second trench 44 that is formed on portions of the lower metal layer 37. The fourth insulation layer 38 has a thickness of about 0.01 to 0.3 microns. A fifth insulation layer 41 is formed on the fourth insulation layer 38 and has a thickness of about 0.05 to 0.5 microns. Another important feature is that the fifth insulation layer 41 is comprised of a different material than in the fourth insulation layer 38. In a preferred embodiment where the fourth insulation layer 38 is $Al_2O_3$, the fifth insulation layer 41 is comprised of silicon oxide. Alternatively, the fourth insulation layer 38 may be one of silicon nitride, silicon oxynitride, and silicon carbide and the fifth insulation layer 41 may be silicon oxide or $Al_2O_3$.

A plurality of first trenches 43 is formed within the fourth insulation layer 41 above each MTJ 36 such that each first trench has a length x of about 0.2 to 0.8 microns. Each first trench 43 has sidewalls and a bottom on which a conformal diffusion barrier layer 45 is formed. There is an upper metal layer 46a comprised of the same metal as in the upper metal layer 46b on the diffusion barrier layer 45. The upper metal layer 46a is coplanar with the fifth insulation layer 41 and the upper metal layer 46b. The upper metal layer 46a forms a word line that is perpendicular to the bit lines in the second conductive layer. The distance y between a first trench 43 and second trench 44 is about 0.1 to 0.2 microns.

From a top-down view in FIG. 9, the width w of the upper metal layer 46b is about equal to the width of a lower metal layer 37. The sectioned conductive line 34 which is also referred to as a bottom electrode has a rectangular shape in which there is a width a that is greater than the width x and a length b that is larger than the width w. Each bit line has a thicker portion between parallel word lines 46a in which the thicker portion is comprised of an upper metal layer 46b, a diffusion barrier layer (not shown), and a lower metal layer 37. The resulting bit lines have a lower line resistance as described previously which allows a higher MRAM cell packing density in the MRAM array.

While this invention has been particularly shown and described with reference to, the preferred embodiment thereof, it will be understood by those skilled in the art that various changes in form and details may be made without departing from the spirit and scope of this invention.

We claim:

1. A method of fabricating an MRAM array on a substrate, comprising:
   (a) forming a first conductive layer comprised of a plurality of sectioned first lines on a substrate;
   (b) forming an array of magnetic tunnel junctions (MTJs) on the first conductive layer; and
   (c) forming a second conductive layer comprised of a plurality of parallel second lines on said MTJs wherein an MTJ is formed at each location where a second line crosses over a sectioned first line and wherein said second lines have thinner and thicker regions, said thicker regions are not formed above an MTJ or adjacent to an MTJ.

2. The method of claim 1 wherein the first conductive layer is comprised of sectioned first lines formed on a first insulation layer and within a second insulation layer that is on the first insulation layer.

3. The method of claim 2 wherein said MTJs are coplanar with a third insulation layer that is formed on said second insulation layer and first conductive layer.

4. The method of claim 3 wherein thinner regions of said second lines are formed above said MTJs and portions of the third insulation layer that are adjacent to the MTJs and has a thickness of about 0.02 to 0.3 microns.

5. The method of claim 3 further comprised of forming a fourth insulation layer on the third insulation layer, forming a fifth insulation layer on the fourth insulation layer, and forming an array of parallel word lines above said MTJs in said fifth insulation layer wherein said word lines are perpendicular to said second lines which are bit lines.

6. The method of claim 1 wherein said second conductive layer is comprised of second lines which are bit lines.

7. The method of claim 6 wherein a thinner region of a bit line is a lower metal layer comprised of a first diffusion barrier layer or adhesion layer and a conductive layer which is copper or gold formed on the first diffusion barrier layer or adhesion layer.

8. The method of claim 7 wherein a thicker region of a bit line is comprised of said lower metal layer, a second diffusion barrier layer on the lower metal layer, and an upper metal layer on the second diffusion barrier layer.

9. The method of claim 8 wherein said first and second diffusion barrier layers are comprised of Ta/TaN or Ti/TiN and said upper metal layer has the same composition as the conductive layer in the lower metal layer.

10. The method of claim 1 wherein thicker regions of said second lines have a thickness of about 0.08 to 1.1 microns.

11. A method for fabricating an MRAM array on an MRAM chip, comprising:
(a) forming a first conductive layer comprised of a plurality of sectioned first lines in a second insulation layer on a substrate that has an upper first insulation layer;
(b) forming an array of MTJs on said first conductive layer and forming a planar third insulation layer on said second insulation layer and first conductive layer wherein said third insulation layer is coplanar with said MTJs;
(c) forming a second conductive layer which is a lower metal layer comprised of a plurality of parallel second lines having a first thickness and a first width on said MTJs and third insulation layer, said second lines are formed in and are coplanar with a dielectric layer;
(d) forming a fourth insulation layer on said second conductive layer and dielectric layer and forming openings over portions of said second lines that are not above said MTJs;
(e) forming a fifth insulation layer on said fourth insulation layer and second lines and forming a pattern comprised of a plurality of first trenches having sidewalls and bottoms on said fourth insulation layer and above said MTJs and a plurality of second trenches having sidewalls and bottoms on portions of said second lines that are not above said MTJs;
(f) depositing a conformal diffusion barrier layer on the sidewalls and bottoms of said first trenches and second trenches and depositing an upper metal layer on said diffusion barrier layer that fills said first and second trenches; and
(g) planarizing said diffusion barrier layer and upper metal layer to be coplanar with said fifth insulation layer thereby forming parallel third lines in said first trenches, and thicker regions of said second lines where a second trench is formed on said lower metal layer wherein a lower metal layer, an overlying diffusion barrier layer, and an upper metal layer on the diffusion barrier layer form a thicker region that has a second thickness greater than said first thickness.

12. The method of claim 11 wherein said sectioned first lines are bottom electrodes, said second lines are bit lines, and said third lines are word lines.

13. The method of claim 11 wherein said first thickness is about 0.02 to 0.3 microns and said first width is about 0.3 to 1.2 microns.

14. The method of claim 11 wherein an MTJ is formed at each location where a second line crosses over a sectioned first line.

15. The method of claim 11 wherein said openings are trenches and are formed over portions of said second lines where a second trench is formed in a subsequent step.

16. The method of claim 11 wherein said fourth insulation layer has a thickness between about 0.01 and 0.3 microns.

17. The method of claim 11 wherein forming said first trenches and second trenches is comprised of forming a photoresist pattern on said fifth insulation layer, selectively etching said fifth insulation layer, and stopping on said fourth insulation layer at the bottom of said first trenches and on said second lines at the bottom of said second trenches.

18. The method of claim 17 wherein said fifth insulation layer has a thickness between about 0.05 and 0.5 microns and has a different composition than the fourth insulation layer in order to provide sufficient etch selectivity during the formation of the first and second trenches.

19. The method of claim 18 wherein the fourth insulation layer is comprised of $Al_2O_3$, the fifth insulation layer is comprised of silicon oxide, and said selective etching involves a plasma etch with a fluorine containing gas.

20. The method of claim 11 wherein said first trenches have a length of about 0.2 to 0.8 microns.

21. The method of claim 11 wherein said second trenches have a length of about 0.5 to 1.5 microns.

22. The method of claim 11 wherein the fifth insulation layer has a width of about 0.1 to 0.2 microns between a first trench and a second trench.

23. The method of claim 11 wherein said lower metal layer is comprised of a diffusion barrier layer and a conductive layer on the diffusion barrier layer and said conductive layer is comprised of the same metal as in the upper metal layer.

24. The method of claim 11 wherein said second thickness is between about 0.08 and 1.1 microns.

25. The method of claim 11 wherein the upper metal layer has a width about equal to the first width of the lower metal layer.

26. The method of claim 11 wherein said sectioned first lines are comprised of Ta, Ru, W, Al, or Cu and said second lines are comprised of copper or gold.

* * * * *